(12) United States Patent
Ma et al.

(10) Patent No.: US 10,917,227 B2
(45) Date of Patent: Feb. 9, 2021

(54) DATA TRANSMISSION AND RECEPTION METHOD, APPARATUS AND STORAGE MEDIUM

(71) Applicant: BOE Technology Group Co., Ltd., Beijing (CN)

(72) Inventors: Xitong Ma, Beijing (CN); Ran Duan, Beijing (CN); Lihua Geng, Beijing (CN); Yanfu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/555,467

(22) Filed: Aug. 29, 2019

(65) Prior Publication Data

US 2020/0313843 A1 Oct. 1, 2020

(30) Foreign Application Priority Data

Mar. 29, 2019 (CN) .......................... 2019 1 0251000

(51) Int. Cl.
*H04L 7/00* (2006.01)
*H04L 7/033* (2006.01)

(52) U.S. Cl.
CPC .......... *H04L 7/0087* (2013.01); *H04L 7/0091* (2013.01); *H04L 7/0331* (2013.01)

(58) Field of Classification Search
CPC .... H04L 7/0087; H04L 7/0091; H04L 7/0331
See application file for complete search history.

(56) References Cited

U.S. PATENT DOCUMENTS

| 5,635,938 | A  | * | 6/1997  | Komoto ................. | H04B 14/04 341/200 |
|-----------|----|---|---------|------------------------|-----------------------|
| 5,963,260 | A  | * | 10/1999 | Bakhmutsky ..........   | H04N 19/90 375/240.24 |
| 2007/0091935 | A1 | * | 4/2007 | Yonezawa ..........    | H04N 21/4305 370/503 |
| 2008/0155353 | A1 | * | 6/2008 | Craske ................ | G06F 11/3636 714/45 |
| 2014/0177735 | A1 | * | 6/2014 | Nonaka .................| H03M 13/05 375/240.27 |
| 2018/0242020 | A1 | * | 8/2018 | Siddeq ...................| H04N 19/48 |

* cited by examiner

*Primary Examiner* — David B Lugo
(74) *Attorney, Agent, or Firm* — Banner & Witcoff, Ltd.

(57) ABSTRACT

The present disclosure provides a data transmission method, includes: multiplying a frequency of a basic clock, so as to obtain a frequency-multiplied clock, in which a maximum number of high levels in the frequency-multiplied clock is greater than a maximum numerical value that the bit number can represent; removing an invalid bit width from the data to be transmitted, and determining a bit number of an effective bit width thereof and a numerical value represented by the effective bit width; determining a data period, according to the bit number of the effective bit width in the data to be transmitted; determining an actual number of high levels, according to a numerical value represented by the effective bit width in the data to be transmitted; and transmitting the data to be transmitted based on the frequency-multiplied clock, according to the data period and the actual number of the high levels.

17 Claims, 5 Drawing Sheets

DATA TRANSMISSION AND RECEPTION METHOD, APPARATUS AND STORAGE MEDIUM

CROSS REFERENCE TO RELATED APPLICATIONS

The present application claims priority of Chinese Patent Application No. 201910251000.1 filed on Mar. 29, 2019, the disclosure of which is incorporated herein by reference in its entirety as part of the present application.

TECHNICAL FIELD

The present disclosure relates to a video signal transmission technical field, particularly, relates to a data transmission and reception method, a corresponding apparatus and a storage medium.

BACKGROUND

In the field of ultra-high definition video signal transmission, a bandwidth has become a key factor restricting the ultra-high definition video signal transmission. Taking an 8K ultra-high definition video signal as an example, its standard resolution is 7680*4320, refresh frequency is 60 Hz, and the required data bit width is 71 Gb/s bandwidth.

How to improve transmission efficiency of an ultra-high definition video signal is an urgent problem to be solved at present.

SUMMARY

In a first aspect, at least one embodiment of the present disclosure provides a data transmission method which comprises: multiplying a frequency of a basic clock, according to a bit number of a bit width of data to be transmitted, so as to obtain a frequency-multiplied clock, in which a maximum number of high levels in the frequency-multiplied clock is greater than a maximum numerical value that the bit number can represent; removing an invalid bit width from the data to be transmitted, and determining a bit number of an effective bit width in the data to be transmitted and a numerical value represented by the effective bit width; determining a data period, according to the bit number of the effective bit width in the data to be transmitted; determining an actual number of high levels, according to a numerical value represented by the effective bit width in the data to be transmitted; and transmitting the data to be transmitted based on the frequency-multiplied clock, according to the data period and the actual number of the high levels.

Alternatively, determining the data period according to the bit number of the effective bit width in the data to be transmitted, comprises: determining a product of the bit number of the effective bit width in the data to be transmitted and a period of the basic clock as the data period.

Alternatively, determining the number of the high levels, according to the numerical value represented by the effective bit width in the data to be transmitted, comprises: adding one to the numerical value represented by the effective bit width in the data to be transmitted so as to obtain the actual number of the high levels.

In a second aspect, at least one embodiment of the present disclosure provides a data reception method which comprises: multiplying a frequency of a basic clock, according to a bit number of a bit width of received data, so as to obtain a frequency-multiplied clock, in which a maximum number of high levels in the frequency-multiplied clock is greater than a maximum numerical value that the bit number can represent; determining a position of a rising edge of the received data, according to the frequency-multiplied clock; determining a bit number of an effective bit width of the received data and a numerical value represented by the effective bit width, according to the position of the rising edge of the received data; and decoding the received data, according to the effective bit width and the numerical value represented by the effective bit width.

Alternatively, determining the position of the rising edge of the received data, according to the frequency-multiplied clock, comprises: delaying the received data by one clock cycle based on the frequency-multiplied clock, so as to obtain a delayed data; and detecting a rising edge of the received data based on the delayed data, and determining the position of the rising edge of the received data.

Alternatively, determining the bit number of the effective bit width of the received data according to the position of the rising edge of the received data, comprises: determining a clock cycle number of the basic clock between two adjacent rising edges in the received data, according to the position of the rising edge of the received data; and determining the clock cycle number of the basic clock between two adjacent rising edges in the received data as the bit number of the effective bit width of the received data.

Alternatively, determining the numerical value represented by the effective bit width, according to the position of the rising edge of the received data, comprises: determining an actual number of high levels between two adjacent rising edges in the received data, according to the position of the rising edge of the received data; and adding one to the actual number of the high levels, so as to obtain the numerical value represented by the effective bit width of the received data.

In a third aspect, at least one embodiment of the present disclosure provides a data transmission apparatus which comprises: a phase locked loop circuit, which multiplies a frequency of a basic clock, according to a bit number of a bit width of data to be transmitted, so as to obtain a frequency-multiplied clock, in which a maximum number of high levels in the frequency-multiplied clock is greater than a maximum numerical value that the bit number can represent; a data encoding circuit, which removes an invalid bit width from the data to be transmitted, and determines a bit number of an effective bit width in the data to be transmitted and a numerical value represented by the effective bit width; determines a data period, according to the bit number of the effective bit width in the data to be transmitted; determines an actual number of high levels, according to a numerical value represented by the effective bit width in the data to be transmitted; and transmits the data to be transmitted based on the frequency-multiplied clock, according to the data period and the actual number of the high levels.

Alternatively, in the data encoding circuit, a product of the bit number of the effective bit width in the data to be transmitted and a period of the basic clock is determined as the data period.

Alternatively, the phase locked loop circuit adds one to the numerical value represented by the effective bit width in the data to be transmitted, so as to obtain the actual number of the high levels.

In a fourth aspect, at least one embodiment of the present disclosure provides a data reception apparatus which comprises: a phase locked loop circuit, which multiplies a frequency of a basic clock, according to a bit number of a bit width of received data, so as to obtain a frequency-multiplied clock, in which a maximum number of high levels in the frequency-multiplied clock is greater than a maximum numerical value that the bit number can represent; an edge detection circuit, which determines a position of a rising edge of the received data, according to the frequency-multiplied clock; and a data sampling circuit, which determines a bit number of an effective bit width of the received data and a numerical value represented by the effective bit width, according to the position of the rising edge of the received data; and decodes the received data, according to the effective bit width and the numerical value represented by the effective bit width.

Alternatively, in the phase locked loop circuit, the received data is delayed by one clock cycle based on the frequency-multiplied clock, so as to obtain a delayed data; a rising edge of the received data is detected based on the delayed data, and the position of the rising edge of the received data is determined.

Alternatively, in the edge detection circuit, a clock cycle number of the basic clock between two adjacent rising edges in the received data is determined, according to the position of the rising edge of the received data; and the clock cycle number of the basic clock between two adjacent rising edges in the received data is determined as the bit number of the effective bit width of the received data.

Alternatively, in the data sampling circuit, an actual number of high levels between two adjacent rising edges in the received data is determined, according to the position of the rising edge of the received data; and the actual number of the high levels is subtracted by one, so as to obtain the numerical value represented by the effective bit width of the received data.

In a fifth aspect, at least one embodiment of the present disclosure further provides a computer readable storage medium on which computer program instructions are stored. The method described above is implemented when the computer program instructions are executed by a processor.

In a sixth aspect, at least one embodiment of the present disclosure further provides a data transmission and reception system, which comprises the data transmission apparatus described above and the data reception apparatus described above.

The data transmission scheme provided by the embodiments of the present disclosure, firstly, multiplies a frequency of a basic clock, according to a bit number of a bit width of data to be transmitted, so as to obtain a frequency-multiplied clock; then, removes an invalid bit width from the data to be transmitted, and determines a bit number of an effective bit width in the data to be transmitted and a numerical value represented by the effective bit width; and determines a data period, according to the bit number of the effective bit width in the data to be transmitted; and then determines an actual number of high levels, according to a numerical value represented by the effective bit width in the data to be transmitted; lastly, transmits the data to be transmitted based on the frequency-multiplied clock, according to the data period and the number of the actual high levels. The embodiments of the present disclosure improve data transmission efficiency by eliminating the occupation of bandwidth by invalid bit width of bit data.

BRIEF DESCRIPTION OF THE DRAWINGS

Other features, objects and advantages of the present disclosure will become more apparent by reading the detailed description of non-limiting embodiments made with reference to the following drawings.

DETAILED DESCRIPTION

Figure 1:
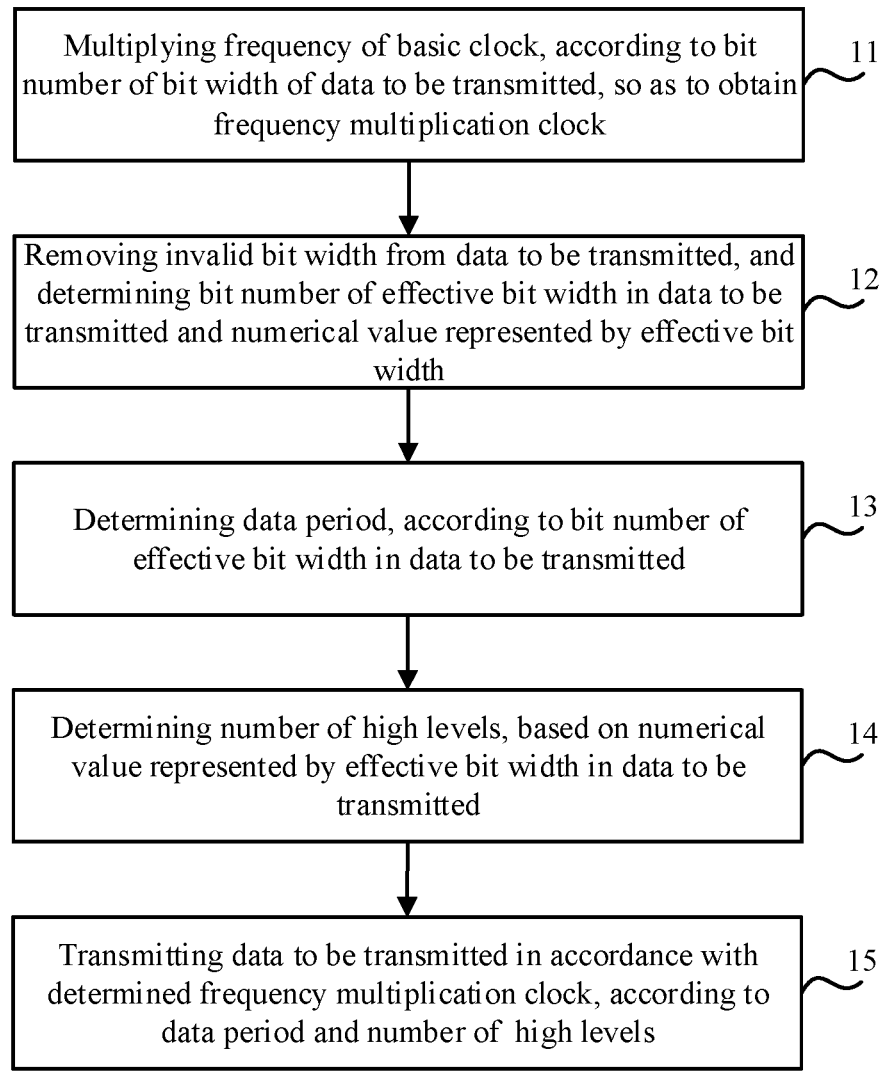
FIG. 1 is an exemplary flowchart of a data transmission method provided by some embodiments of the present disclosure.

The present disclosure will be described in further detail below in connection with the drawings and embodiments. It should be understood that the specific embodiments described herein are only for the purpose of explaining the related invention and not for the purpose of limiting the invention. In addition, it should also be noted that only the parts related to the invention are illustrated in the drawings for convenience of description.

It should be noted that the embodiments and the features in the embodiments in this disclosure may be combined with each other without conflict. Hereinafter, the present disclosure will be described in detail with reference to the drawings and in connection with the embodiments.

Referring to FIG. 1, it is an exemplary flow chart of a data transmission method provided by some embodiments of the present disclosure.

The method includes the steps as follows.

Step 11, multiplying a frequency of a basic clock, according to a bit number of a bit width of data to be transmitted, so as to obtain a frequency-multiplied clock.

Wherein a maximum number of high levels in the frequency-multiplied clock is greater than a maximum numerical value that the bit number can represent. In the embodiments of the present disclosure, an effective data represented by the maximum number of the high levels in the frequency-multiplied clock should be greater than a maximum numerical value that a bit number of the bit width the data to be transmitted can represent. For example, if the bit number of the bit width of the data to be transmitted is 4, then the maximum value the bit number can represent is 15, and the obtained maximum number of the high levels in the frequency-multiplied clock should be greater than 15.

Step 12, removing an invalid bit width from the data to be transmitted, and determining a bit number of an effective bit width in the data to be transmitted and a numerical value represented by the effective bit width.

In the embodiments of the present disclosure, a bit width starting from a first high level bit appearing in the data to be transmitted is an effective bit width, and a bit width before the first high level bit is an invalid bit width. For example, if the data to be transmitted is 0010, the first two 0 are invalid bit widths and the last two bits 10 are effective bit widths.

Step 13: determining a data period, according to the bit number of the effective bit width in the data to be transmitted.

Specifically, a product of the bit number of the valid bit width in the data to be transmitted and a period of the basic clock is determined as the data period.

Step 14: determining an actual number of high levels, based on a numerical value represented by the effective bit width in the data to be transmitted.

Specifically, the numerical value represented by the effective bit width in the data to be transmitted is added with one (1), so as to obtain the actual number of the high levels in the data to be transmitted.

Step 15, transmitting the data to be transmitted based on the determined frequency-multiplied clock, according to the data period and the actual number of the high levels.

The data transmission scheme provided by the embodiments of the present disclosure improves data transmission efficiency by eliminating the occupation of bandwidth by invalid bit width of bit data.

Figure 2:
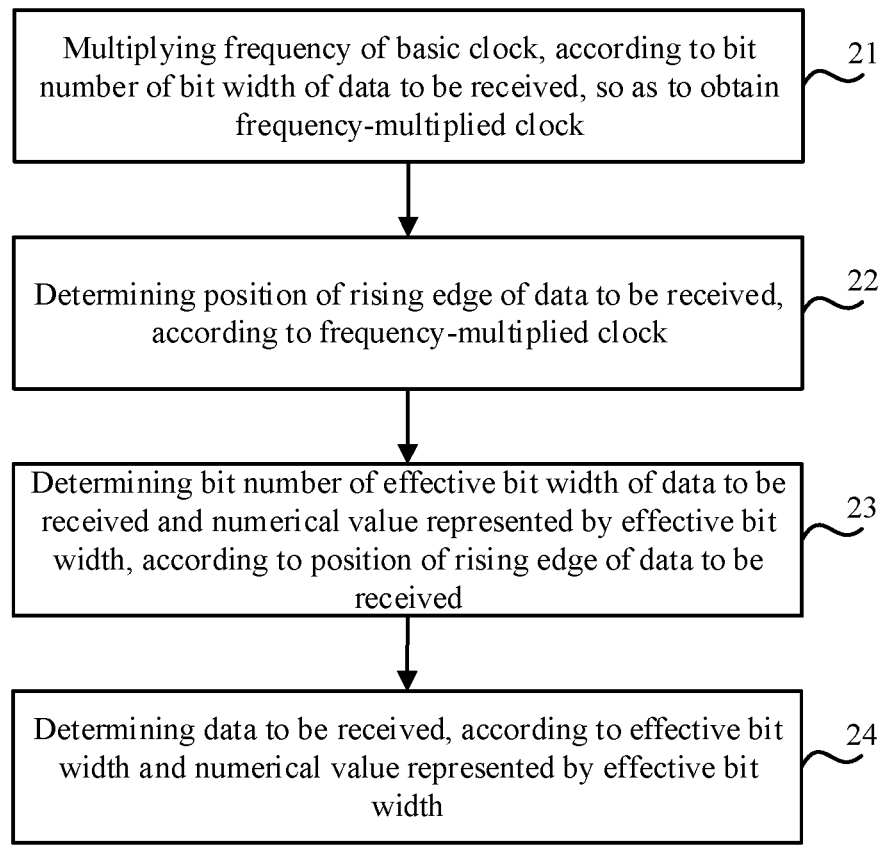
FIG. 2 is an exemplary flowchart of a data reception method provided by some embodiments of the present disclosure.

Referring to FIG. 2, it is an exemplary flowchart of a data reception method provided by some embodiments of the present disclosure.

The method includes the steps as follows.

Step 21, multiplying a frequency of a basic clock, according to a bit number of a bit width of received data, so as to obtain a frequency-multiplied clock.

Wherein a maximum number of high levels in the frequency-multiplied clock is greater than a maximum numerical value that the bit number can represent.

Step 22, determining a position of a rising edge of the received data, according to the frequency-multiplied clock.

Specifically, the received data is delayed by one clock cycle based on the frequency-multiplied clock, so as to obtain a delayed data, and then a rising edge of the received data is detected based on the delayed data, and the position of the rising edge of the received data is determined.

Step 23, determining a bit number of an effective bit width of the received data and a numerical value represented by the effective bit width, according to the position of the rising edge of the received data.

Specifically, the bit number of the effective bit width of the received data may be determined according to the following process: determining a clock cycle number of the basic clock between two adjacent rising edges in the received data, according to the position of the rising edge of the received data, and then determining the clock cycle number of the basic clock between two adjacent rising edges in the received data as the bit number of the effective bit width of the received data.

The numerical value represented by the effective bit width may be determined according to the following process: determining an actual number of high levels between two adjacent rising edges in the received data, according to the position of the rising edge of the received data, and then adding one to the actual number of the high levels, so as to obtain the numerical value represented by the effective bit width of the received data.

Step 24: determining the received data, according to the effective bit width and the numerical value represented by the effective bit width.

The above-mentioned data transmission process and data reception process will be further described below with reference to a flowchart.

In the embodiments of the present disclosure, taking a four-bit data bit width as an example, it is necessary to multiply a frequency of a basic clock by 5 times at a transmission terminal and a reception terminal. For 4-bit-wide data transmission, which after being multiplied by 5 times is equal to 20 frequency-multiplied clock periods, an actual number of high levels may be within a range of 1-19, and an effective data may be represented is 0-18 (numeral value represented by the effective data=number of high levels−1), that is, 4-bit-wide data "0000" to "1111" may be included.

Where the frequency of the basic clock is set as Fclk, and its period is Tclk=1/Fclk; the frequency of the frequency-multiplied clock is Fclk_x5, and its period is Tclk_x5=1/Fclk_x5; and the above two have the following relationships:

Frequency relationship: Fclk_x5=Fclk*5;
Periodic relationship: Tclk=Tclk_x5*5.

In the embodiments of the present disclosure, a transmission of 4-bit bit width 0010 is taken as an example.

Figure 3:
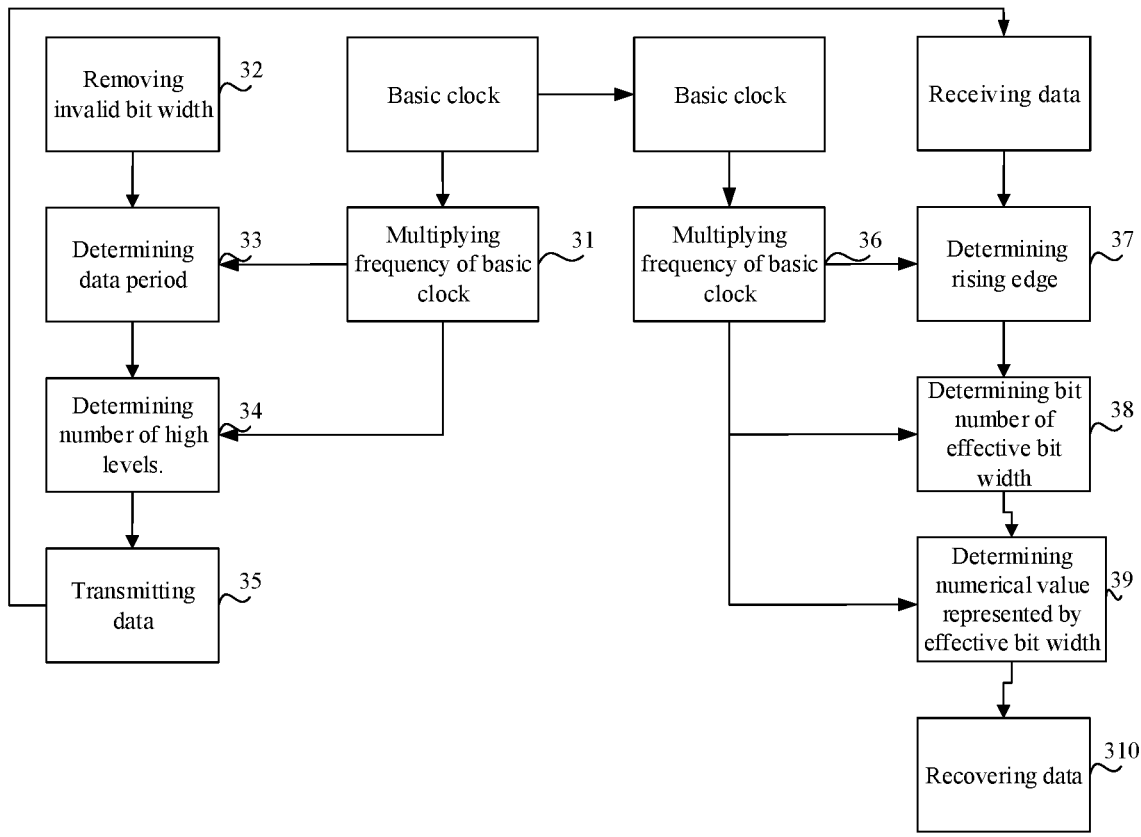
FIG. 3 is a schematic diagram of a data transmission process at a transmission terminal and a reception terminal.

Referring to FIG. 3, it is a schematic diagram of a data transmission process at a transmission terminal and a reception terminal.

Step 31, multiplying a frequency of a basic clock by 5 times at the transmission terminal, so as to obtain a frequency-multiplied clock.

Step 32, removing an invalid bit width.

Wherein the 4-bit bit width 0010, first two 0 are invalid bit widths, and last two bits 10 are effective bit widths. The bit number of the effective bit width is 2, and the represented numerical value is 2.

Step 33: determining a data period.

Wherein the data period=bit number of effective bit width*basic clock period=2*Tclk=2*5*Tclk_x5=10*Tclk_x5, i.e. including 10 frequency-multiplied clocks Fclk_x5.

Step 34: determining an actual number of high levels.

Wherein the number of high levels=numerical value represented by the effective bit width data+1=2+1=3.

Step 35, transmitting data.

According to the determined data period and the actual number of the high levels, the data is transmitted according to 3 high levels and 7 low levels.

Steps 31 to 35 above are a data transmission process.

Step 36, multiplying a frequency of a basic clock by 5 times at the reception terminal, so as to obtain a frequency-multiplied clock.

Step 37: determining a rising edge.

Figure 4:
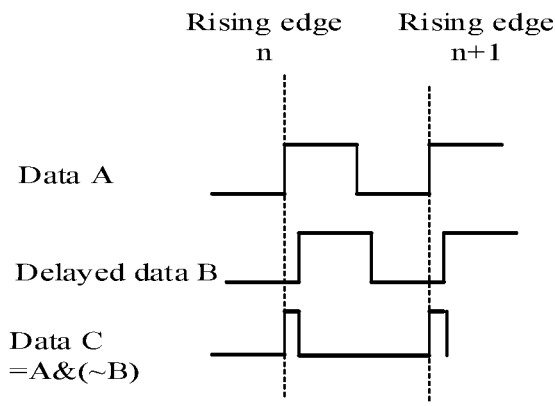
FIG. 4 is a schematic diagram of a rising edge determination process.

Referring to FIG. 4, the rising edge may be determined by using data A and data B which is derived from data A delayed by one clock cycle, and then we have C=A&(~B), and a high level of C is a time point of the rising edge.

Step 38, determining the bit number of the effective bit width.

Wherein the bit number of the effective bit width=number of basic clock periods between adjacent rising edges. Taking the 0010 in the embodiments of the present disclosure as an example, the effective bit width is 2.

Step 39: determining the numerical value represented by the effective bit width.

Wherein, according to the position of the rising edge of the received data, the actual number of high levels between two adjacent rising edges is determined, and then the actual number of high levels is reduced by one, so as to obtain a numerical value represented by the effective bit width data, namely 3−1=2.

Step 310, recovering the data.

According to the determined bit number of the effective bit width and the represented numerical value, the data is further analyzed to be 2-bit bit width 10, namely 0010.

The data transmission scheme provided by the embodiments of the present disclosure includes a data transmission and reception process, which utilizes the periodic characteristic and the duty ratio characteristic of the transmitted data to respectively represent effective bit width information and numerical value information, and remove invalid bits of specific bit numbers, and utilizes the rising edge and the adjacent rising edge of the transmitted signal as natural commas of data to ensure that one rising edge and the adjacent rising edge may transmit data information of specific bits. The embodiments of the disclosure further improves the data transmission efficiency by eliminating the occupation of bandwidth by invalid bit width of bit data.

Figure 5:
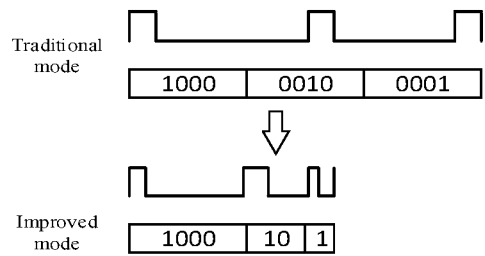
FIG. 5 is a schematic diagram of a data transmission.

Referring to FIG. 5, it is a schematic diagram of a data transmission. The upper half of FIG. 5 is a schematic diagram of a transmission in the prior art, and the lower half is a schematic diagram of an improved transmission in the embodiments of the present disclosure. As can be seen from the figure, the transmission process of the embodiments of the present disclosure may reduce the occupation of bandwidth by the amount of data, thus improving the data transmission efficiency.

It should be noted that although the operations of the disclosed method are described in a specific order in the drawings, this does not require or imply that these operations must be performed in this specific order or that all of the operations illustrated must be performed to achieve the desired results. On the contrary, the steps depicted in the flowcharts may change the order of execution. Additionally or alternatively, certain steps may be omitted, multiple steps may be combined into one step for execution, and/or one step may be decomposed into multiple steps for execution.

Figure 6:
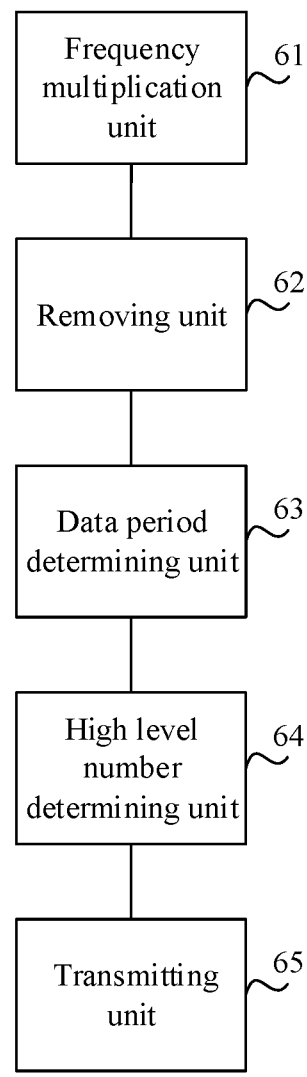
FIG. 6 is an exemplary block diagram of a structure of a data transmission apparatus provided by some embodiments of the present disclosure.

With further reference to FIG. 6, it is an exemplary block diagram of a structure of a data transmission apparatus provided by some embodiments of the present disclosure.

A frequency multiplication unit 61 is configured to multiply a frequency of a basic clock, according to a bit number of a bit width of data to be transmitted, so as to obtain a frequency-multiplied clock. And a maximum number of high levels in the frequency-multiplied clock is greater than a maximum numerical value that the bit number can represent;

A removing unit 62 is configured to remove an invalid bit width from the data to be transmitted, and determine a bit number of an effective bit width in the data to be transmitted and a numerical value represented by the effective bit width;

A data period determining unit 63 is configured to determine a data period, according to the bit number of the effective bit width in the data to be transmitted;

A high level number determining unit 64 is configured to determine an actual number of high levels, according to a numerical value represented by the effective bit width in the data to be transmitted;

A transmitting unit 65 is configured to transmit the data to be transmitted based on the frequency-multiplied clock, according to the data period and the actual number of the high levels.

Alternatively, the data period determining unit 63 is specifically configured to: determine a product of the bit number of the effective bit width in the data to be transmitted and a period of the basic clock as the data period.

Alternatively, the high level number determining unit 64 is specifically configured to: add one to the numerical value represented by the effective bit width in the data to be transmitted so as to obtain the actual number of the high levels.

It should be understood that the sub-systems or units recorded by the above-mentioned data transmission apparatus correspond to various steps in the method described with reference to FIG. 1. Therefore, the operations and features described above for the method are also applicable to the data transmission apparatus and the units contained therein, and will not be repeated again.

Figure 7:
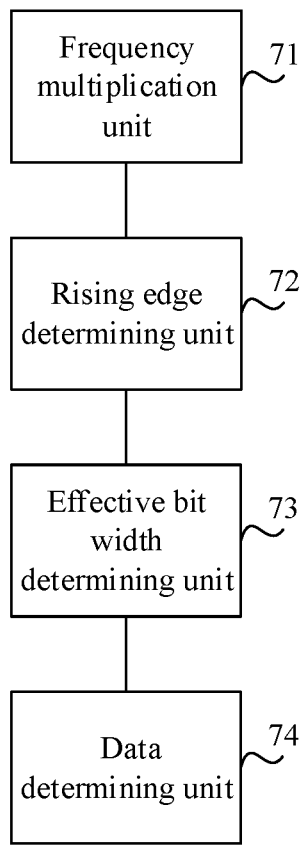
FIG. 7 is an exemplary block diagram of a structure of a data reception apparatus provided by some embodiments of the present disclosure.

With further reference to FIG. 7, it is an exemplary block diagram of a structure of a data reception apparatus provided by some embodiments of the present disclosure.

A frequency multiplication unit 71 is configured to multiply a frequency of a basic clock, according to a bit number of a bit width of received data, so as to obtain a frequency-multiplied clock. And a maximum number of high levels in the frequency-multiplied clock is greater than a maximum numerical value that the bit number can represent.

A rising edge determining unit 72 is configured to determine a position of a rising edge of the received data, according to the frequency-multiplied clock.

An effective bit width determining unit 73 is configured to determine a bit number of an effective bit width of the received data and a numerical value represented by the effective bit width, according to the position of the rising edge of the received data.

A data determining unit 74 is configured to determine the received data, according to the effective bit width and the numerical value represented by the effective bit width.

Alternatively, the rising edge determining unit 72 is specifically used to: delay the received data by one clock cycle based on the frequency-multiplied clock, so as to obtain a delayed data; and detect a rising edge of the received data based on the delayed data, and determine the position of the rising edge of the received data based on the delayed data.

Alternatively, the effective bit width determination unit 73 is specifically used to: determine a clock cycle number of the basic clock between two adjacent rising edges in the received data, according to the position of the rising edge of the received data; and determine the clock cycle number of the basic clock between two adjacent rising edges in the received data as the bit number of the effective bit width of the received data.

Alternatively, the effective bit width determination unit 73 is specifically used to: determine an actual number of high levels between two adjacent rising edges in the received data, based on the position of the rising edge of the received data; and subtract one from the actual number of the high levels, so as to obtain the numerical value represented by the effective bit width of the received data.

It should be understood that the sub-systems or units recorded by the above-mentioned data reception apparatus correspond to various steps in the method described with reference to FIG. 2. Therefore, the operations and features described above for the method are also applicable to the data reception apparatus and the units contained therein, and will not be repeated again.

Figure 8:
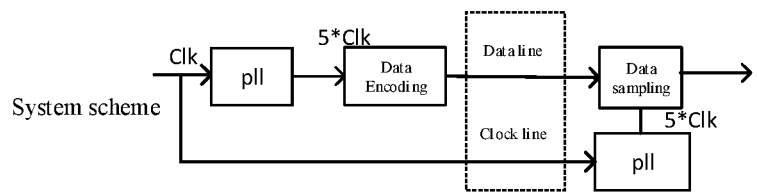
FIG. 8 is a schematic diagram of a data transmission and reception system provided by some embodiments of the present disclosure.

FIG. 8 illustrates a schematic diagram of a data transmission and reception system provided by some embodiments of the present disclosure. As illustrated in FIG. 8, the data transmission and reception system includes a transmission terminal and a reception terminal. As an example, the system may be composed of a phase locked loop circuit, a data encoding circuit, an edge detection circuit and a data sampling circuit.

The transmission terminal consists of the phase locked loop circuit and the data encoding circuit. The phase locked loop circuit is used to multiply a frequency of a basic clock so as to generate a sampling clock. The data encoding circuit encodes data. In an example, the operations performed by the data encoding circuit may include steps 12 to 15 as illustrated in FIG. 1.

The reception terminal consists of a phase locked loop circuit, an edge detection circuit (not shown) and a data sampling circuit. The phase locked loop is used to multiply (e.g., quintuple) a frequency of a basic clock signal (Clk) so as to generate a sampling clock signal (e.g., 5*Clk). The edge detection circuit is used to detect a rising edge of the data at the reception terminal so as to determine an effective boundary of the data. The data sampling circuit decodes the data, and in an example, the data sampling circuit performs steps 23 to 24 as illustrated in FIG. 2.

As another aspect, the present disclosure also provides a computer readable medium, which may be included in the electronic device described in the above embodiments; and may also exist alone without being assembled into the electronic device. The computer readable medium carries one or more programs that, when executed by the electronic device, causing the electronic device to implement the data transmission method or the data reception method as described in the above embodiments.

It should be noted that although several modules or units of a device for execution are mentioned in the above detailed description, such division is not mandatory. In fact, according to embodiments of the present disclosure, features and functions of two or more modules or units described above may be embodied in one module or unit. On the contrary, the features and functions of one module or unit described above may be further divided into being embodied by a plurality of modules or units.

Furthermore, although the various steps of the method in the present disclosure are described in a specific order in the drawings, this does not require or imply that these steps must be performed in this specific order or that all of the illustrated steps must be performed to achieve the desired results. Additionally or alternatively, certain steps may be omitted, multiple steps may be combined into one step for execution, and/or one step may be decomposed into multiple steps for execution, etc.

From the above description of the embodiments, those skilled in the art will readily understand that the example embodiments described herein may be implemented by software or by software combined with necessary hardware.

What is claimed is:

1. A data transmission method, comprising:
   multiplying a frequency of a basic clock, according to a bit number of a bit width of data to be transmitted, so as to obtain a frequency-multiplied clock, a maximum number of high levels in the frequency-multiplied clock being greater than a maximum numerical value that the bit number can represent;
   removing an invalid bit width from the data to be transmitted, and determining a bit number of an effective bit width in the data to be transmitted and a numerical value represented by the effective bit width;
   determining a data period, according to the bit number of the effective bit width in the data to be transmitted;
   determining an actual number of the high levels, according to the numerical value represented by the effective bit width in the data to be transmitted; and
   transmitting the data to be transmitted based on the frequency-multiplied clock, according to the data period and the actual number of the high levels.

2. The method according to claim 1, wherein determining the data period according to the bit number of the effective bit width in the data to be transmitted, comprises:
   determining a product of the bit number of the effective bit width in the data to be transmitted and a period of the basic clock as the data period.

3. The method according to claim 1, wherein determining the actual number of the high levels, according to the numerical value represented by the effective bit width in the data to be transmitted, comprises:
   adding one to the numerical value represented by the effective bit width in the data to be transmitted so as to obtain the actual number of the high levels.

4. A data reception method, comprising:
   multiplying a frequency of a basic clock, according to a bit number of a bit width of received data, so as to obtain a frequency-multiplied clock, and a maximum number of high levels in the frequency-multiplied clock being greater than a maximum numerical value that a bit number can represent;
   determining a position of a rising edge of the received data, according to the frequency-multiplied clock;
   determining a bit number of an effective bit width of the received data and a numerical value represented by the effective bit width, according to the position of the rising edge of the received data; and
   decoding the received data, according to the effective bit width and the numerical value represented by the effective bit width.

5. The method according to claim 4, wherein determining the position of the rising edge of the received data, according to the frequency-multiplied clock, comprises:
   delaying the received data by one clock cycle based on the frequency-multiplied clock, so as to obtain a delayed data; and
   detecting a rising edge of the received data based on the delayed data, and determining the position of the rising edge of the received data.

6. The method according to claim 4, wherein determining the bit number of the effective bit width of the received data according to the position of the rising edge of the received data, comprises:
   determining a clock cycle number of the basic clock between two adjacent rising edges in the received data, according to the position of the rising edge of the received data; and
   determining the clock cycle number of the basic clock between two adjacent rising edges in the received data as the bit number of the effective bit width of the received data.

7. The method according to claim 4, wherein determining the numerical value represented by the effective bit width, according to the position of the rising edge of the received data, comprises:
   determining an actual number of high levels between two adjacent rising edges in the received data, according to the position of the rising edge of the received data; and
   subtracting one from the number of the high levels, so as to obtain the numerical value represented by the effective bit width of the received data.

8. A data transmission apparatus for performing the method according to claim 1, comprising:
   a phase locked loop circuit, which multiplies a frequency of a basic clock, according to a bit number of a bit width of data to be transmitted, so as to obtain a frequency-multiplied clock, and a maximum number of high levels in the frequency-multiplied clock being greater than a maximum numerical value that the bit number can represent; and a data encoding circuit, which removes an invalid bit width from the data to be transmitted, and determines a bit number of an effective bit width in the data to be transmitted and a numerical value represented by the effective bit width; determines a data period, according to the bit number of the effective bit width in the data to be transmitted; determines an actual number of high levels, according to a numerical value represented by the effective bit width in the data to be transmitted; and transmits the data to be transmitted based on the frequency-multiplied clock, according to the data period and the actual number of the high levels.

9. The data transmission apparatus according to claim 8, wherein, in the data encoding circuit, a product of the bit number of the effective bit width in the data to be transmitted and a period of the basic clock is determined as the data period.

10. The data transmission apparatus according to claim 8, wherein the phase locked loop circuit adds one to the numerical value represented by the effective bit width in the data to be transmitted, so as to obtain the actual number of the high levels.

11. A data reception apparatus for performing the method according to claim 4, comprising:

a phase locked loop circuit, which multiplies a frequency of a basic clock, according to a bit number of a bit width of received data, so as to obtain a frequency-multiplied clock, and a maximum number of high levels in the frequency-multiplied clock being greater than a maximum numerical value that the bit number can represent;

an edge detection circuit, which determines a position of a rising edge of the received data, according to the frequency-multiplied clock; and a data sampling circuit, which determines a bit number of an effective bit width of the received data and a numerical value represented by the effective bit width, according to the position of the rising edge of the received data; and decoding the received data, according to the effective bit width and the numerical value represented by the effective bit width.

12. The data receiving device according to claim 11, wherein, in the phase locked loop circuit, the received data is delayed by one clock cycle based on the frequency-multiplied clock, so as to obtain a delayed data; a rising edge of the received data is detected based on the delayed data, and the position of the rising edge of the received data is determined.

13. The data reception apparatus according to claim 11, wherein, in the edge detection circuit, a clock cycle number of the basic clock between two adjacent rising edges in the received data is determined, according to the position of the rising edge of the received data; and the clock cycle number of the basic clock between two adjacent rising edges in the received data is determined as the bit number of the effective bit width of the received data.

14. The data reception apparatus according to claim 11, wherein, in the data sampling circuit, an actual number of high levels between two adjacent rising edges in the received data is determined, according to the position of the rising edge of the received data; and the actual number of the high levels is subtracted by one, so as to obtain the numerical value represented by the effective bit width of the received data.

15. A non-transitory computer-readable storage medium comprising computer program instructions that, when executed by a processor, cause the processor to perform the method according to claim 1.

16. A non-transitory computer-readable storage medium comprising computer program instructions that, when executed by a processor, cause the processor to perform the method according to claim 4.

17. A data transmission and reception system, comprising a data transmission apparatus and a data reception apparatus, wherein the data transmission apparatus comprises:

a phase locked loop circuit, which multiplies a frequency of a basic clock, according to a bit number of a bit width of data to be transmitted, so as to obtain a frequency-multiplied clock, and a maximum number of high levels in the frequency-multiplied clock being greater than a maximum numerical value that the bit number can represent;

a data encoding circuit, which removes an invalid bit width from the data to be transmitted, and determines a bit number of an effective bit width in the data to be transmitted and a numerical value represented by the effective bit width; determines a data period, according to the bit number of the effective bit width in the data to be transmitted; determines an actual number of high levels, according to a numerical value represented by the effective bit width in the data to be transmitted; and transmits the data to be transmitted based on the frequency-multiplied clock, according to the data period and the actual number of the high levels; and the data reception apparatus comprises:

a phase locked loop circuit, which multiplies a frequency of a basic clock, according to a bit number of a bit width of received data, so as to obtain a frequency-multiplied clock, and a maximum number of high levels in the frequency-multiplied clock being greater than a maximum numerical value that the bit number can represent;

an edge detection circuit, which determines a position of a rising edge of the received data, according to the frequency-multiplied clock; and a data sampling circuit, which determines a bit number of an effective bit width of the received data and a numerical value represented by the effective bit width, according to the position of the rising edge of the received data; and decoding the received data, according to the effective bit width and the numerical value represented by the effective bit width.

\* \* \* \* \*